(12) United States Patent
Satish et al.

(10) Patent No.: US 6,698,004 B2
(45) Date of Patent: Feb. 24, 2004

(54) PIN TOGGLING USING AN OBJECT ORIENTED PROGRAMMING LANGUAGE

(75) Inventors: Keshava I. Satish, Union City, CA (US); Neil Korpusik, Campbell, CA (US)

(73) Assignee: Sun Microsystems, Inc., Santa Clara, CA (US)

(*) Notice: Subject to any disclaimer, the term of this patent is extended or adjusted under 35 U.S.C. 154(b) by 0 days.

(21) Appl. No.: 10/176,597

(22) Filed: Jun. 20, 2002

(65) Prior Publication Data

US 2003/0237060 A1 Dec. 25, 2003

(51) Int. Cl.[7] .......................... G06F 17/50; G01R 31/28; G06G 7/62
(52) U.S. Cl. ...................... 716/4; 714/741; 714/739; 716/3; 716/5; 703/17
(58) Field of Search ............... 716/4, 3, 5, 7; 714/741, 739; 703/17

(56) References Cited

U.S. PATENT DOCUMENTS

| | | | |
|---|---|---|---|
| 5,809,036 A | 9/1998 | Champlin | 371/22.31 |
| 6,195,774 B1 | 2/2001 | Jacobson | 714/727 |
| 6,446,243 B1 * | 9/2002 | Huang et al. | 716/7 |
| 6,493,841 B1 * | 12/2002 | Kim et al. | 714/741 |
| 2002/0038447 A1 * | 3/2002 | Kim et al. | 716/4 |
| 2002/0183956 A1 * | 12/2002 | Nightingale | 702/120 |
| 2003/0005416 A1 * | 1/2003 | Henftling et al. | 717/129 |
| 2003/0101040 A1 * | 5/2003 | Nightingale | 703/17 |

OTHER PUBLICATIONS

AT&T News Release, "Tapdance software test VLSI chip designs", http://www.att.com/press/0990/900910.blb.html, 2 pages, Jun. 2002.

* cited by examiner

Primary Examiner—Matthew Smith
Assistant Examiner—Magid Dimyan
(74) Attorney, Agent, or Firm—Thelen Reid & Priest LLP; Adrieene Yeung; Marc Hanish (57) ABSTRACT

The present invention provides a solution for converting a boundary scan description language (BSDL) file to a hardware verification language (HVL) test program file. The BSDL file is scanned for header information and the header information is stored in a header object. The BSDL file is then scanned for pin information, the pin information corresponding to at least one pin in the BSDL file having a pin location, and stored in a pin object. At least one variable for the HVL test program file is created and bound to one of the pin locations resulting in a binding relationship for each variable. The binding relationships are then stored in a bind object. The present invention is designed to overcome the disadvantages of the prior art.

57 Claims, 5 Drawing Sheets

PIN TOGGLING USING AN OBJECT ORIENTED PROGRAMMING LANGUAGE

FIELD OF THE INVENTION

The present invention relates to the testing of integrated circuits. More particularly, the present invention relates to the testing of integrated circuits using an object oriented programming language.

BACKGROUND OF THE INVENTION

With the high level of complexity of modern integrated circuits (ICs), it is becoming increasingly difficult to test the ICs to ensure that they are manufactured with no defects. Complex ICs are often tested or verified during production to make sure they function properly. Generally, a tester applies electric stimuli to the circuit and measures the circuit's response to such stimuli to make sure that it is functioning properly. In order to adequately test the various functional blocks in a typical circuit, long test patterns are often designed.

A typical tester uses a test description language (TDL) for testing a circuit. A test description language is a special language used by a tester to drive the circuit being tested with stimuli, in the form of test patterns, and check the response of the device to such stimuli. A series of test patterns is known as a pattern set. Each pattern specifies the logic values of the inputs and outputs of a circuit during one clock cycle. Each pattern in a pattern set is applied sequentially to the circuit.

Boundary scan testing using Boundary Scan Description Language (BSDL), as further described in IEEE 1149.1 and is well known to those of ordinary skill in the art, is commonly utilized to test the interconnections between ICs that comprise a system. The BSDL format file contains the details of every pin of an IC. The ICs can include, for example, application specific integrated circuits (ASICs), hybrids, and circuit boards. For boundary scan test capability, a circuit includes scan circuits that are capable of isolating device input circuits and output circuits from the interior logic of the device and directly accessing such input circuits and output circuits, which allows special interconnection test patterns to be applied and observed without interference from the interior logic functions.

Boundary scan test capability is commonly implemented with boundary scan cells respectively associated with those input circuits and output circuits for which boundary scan testing capability is being provided, with each boundary scan cell containing a scan flip-flop. Boundary scan chip architecture is commonly known to those of ordinary skill in the art and will thus not be discussed. The scan flip-flops are arranged into a register chain that is capable of operation in serial and parallel modes, so that test patterns can be loaded serially, applied in parallel, and test results can be read out serially.

For testing, special interconnection test patterns are serially loaded into scan flip-flops for device output circuits. After a test pattern is loaded, the output scan cells containing the test pattern are switched to drive their associated output circuits in accordance with the test pattern. Subsequently, the signals observed on input circuits are stored in associated input scan flip-flops. The stored inputs are then serially read out to evaluate the test. A further test pattern can be serially loaded into output scan flip-flops while stored inputs are being serially read out.

Boundary scan test patterns are basically designed to drive or toggle each pin of the device to the high state and low state at different times. However, currently, for every device tested, its own dedicated test bench must be developed to achieve the toggling of every pin in the device. Thus, a generic methodology for toggling every pin of a digital device is not available. Accordingly, what is needed is a solution that allows the toggling of every pin of any digital device.

BRIEF DESCRIPTION OF THE INVENTION

The present invention provides a solution for converting a boundary scan description language (BSDL) file to a hardware verification language (HVL) test program file. The BSDL file is scanned for header information and the header information is stored in a header object. The BSDL file is then scanned for pin information, the pin information corresponding to at least one pin in the BSDL file having a pin location, and stored in a pin object. At least one variable for the HVL test program file is created and bound to one of the pin locations resulting in a binding relationship for each variable. The binding relationships are then stored in a bind object. The present invention is designed to overcome the disadvantages of the prior art.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Embodiments of the present invention are described herein in the context of pin toggling using an object oriented programming language. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application—and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with the present invention, the components, process steps, and/or data structures may be implemented using various types of operating systems, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein.

The present invention relates to the testing of ICs, described using any hardware attribute (HA) file format, using an object oriented programming language. The hardware attribute file format is any format that describes the features of any hardware such as an IC. The hardware attribute file format may be any format known to those of ordinary skill in the art such as the IEEE 1149.1 boundary scan design language (BSDL) format or an ASCII attribute file format. The present invention describes a solution to convert a HA format file to an object oriented programming hardware verification language (HVL) file to allow for a generic methodology to toggle or drive the pins of an IC. More specifically, a HA format file may be converted to an HVL test program, which may then be run by a simulation, which then may output a test description language program. The test program may then be used to provide stimulus to a digital simulation of an IC, the output of which may be used to create a manufacturing test. In a specific embodiment of the present invention, the object oriented programming language data structure is defined having only one signal port definition wherein each pin of the device is dynamically binded to the object array and can be toggled during simulation.

As further discussed in detail below, the present invention provides for the conversion of a BSDL format file to an HVL test program file by parsing the BSDL file for various information such as header information and pin information. Variables from the HVL test program file may then be bound to each pin information thereby creating a binding relationship. Attributes of the header information, pin information, and the binding relationship may each be stored in its own object and all three objects are compiled and used in a test simulation which may be written in any language. Thus, the present invention allows for a generic methodology to test ICs as further explained below.

Figure 1A:
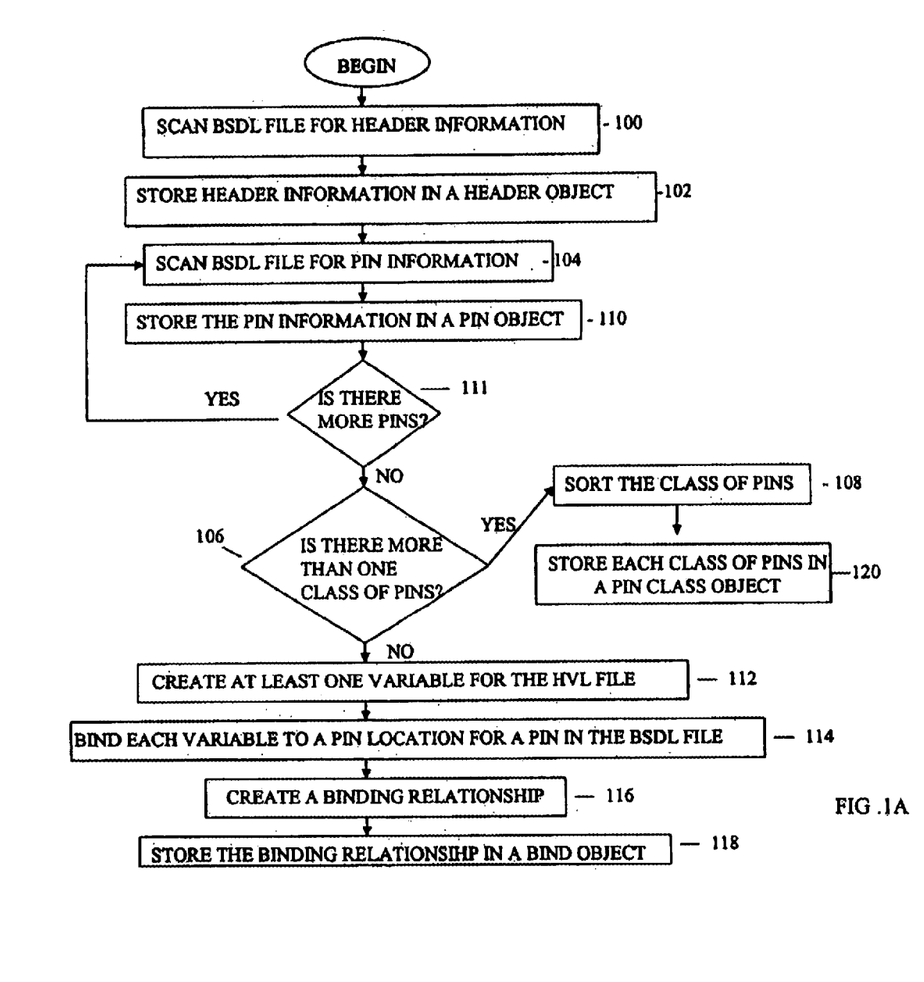
FIGS. 1A and 1B are flow diagrams illustrating a method for converting a BSDL file to an HVL test program file in accordance with a specific embodiment of the present invention.

FIG. 1A is a flow diagram illustrating a method for converting a BSDL file to an HVL test program file in accordance with a specific embodiment of the present invention. The BSDL file represents the structure of the IC and contains the details or attributes of every pin in the circuit such as pin layout, the location of the pins, pin name, test access port (TAP) information, boundary scan register information, and other similar definitions or attributes.

At 100, the BSDL file is scanned for header information. The BSDL file contains header information attributes such as the length of the boundary scan chain, number of compliance pins, TAP instruction length, TAP identification length, and instructions to drive the pins through the register of the circuit. At 102, once the header information is found, it may be stored in a header object of the object oriented programming language. In one embodiment of the present invention, the object oriented programming language may be Open Vera™ HVL created by Synopsys, Inc. of Mountain View, Calif., however, those of ordinary skill in the art will realize that any other type of object oriented programming language may be used. Open Vera™ is chosen in this embodiment due to its dynamic bind function capability. The bind function dynamically matches or hooks each variable to each pin attribute.

At 104, the BSDL file may then be scanned for pin information. Each piece of pin information corresponds to at least one pin in the BSDL file. An object may be created for each pin and its attributes may be stored in a pin object. The pin information includes attributes such as the class of the pin, name of the pin, the bind function the pin is bound to, the location of the pin on the device, the number of boundary scan registers per pin, and other similar attributes. The location of the pin may be its physical location on the circuit or its logical location. Once the pin information for each pin is found, the pin information corresponding to each pin may be stored in its own pin object at 110. If there are more pins at 111, the BSDL file is then scanned for additional pin information at 104. If there are no additional pins at 111, then at 106, if there is more than one class of pins, the pin information may be sorted according to class at 108 and each class may be placed in its own pin class object 120.

At 112, variables corresponding to the object oriented programming language may be created for the HVL test program file. The variables may then be bound with each pin in the BSDL file at 114. Each variable may be bound to the pin location of each pin, thus creating a binding relationship for each variable 116. The binding relationship may then be stored in a bind object at 118.

Figure 1B:
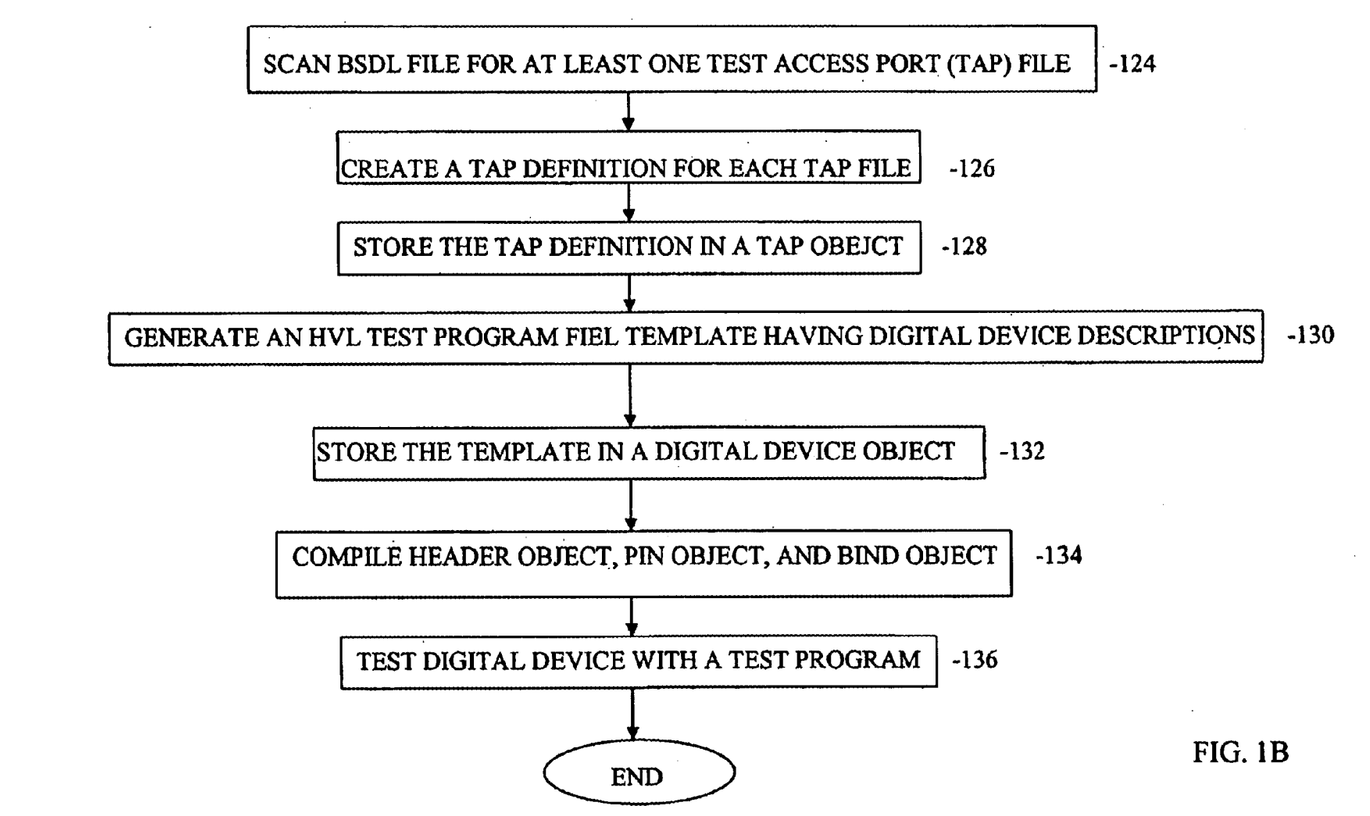

FIG. 1B is a continuation of FIG. 1A. At 124, the BSDL file may be scanned for at least one TAP file. At 126, TAP definitions may be created for each file. The definitions may then be stored in a TAP object at 128. TAP definitions may be attributes such as TAP instructions, port name, and similar attributes.

An HVL test program file template, containing all relevant information about the IC, may be generated for each digital device at 130 and stored in a digital device object at 132. The template may be automatically generated by the object oriented program using descriptions of the IC previously inputted by a user. The template is generated to allow for the dynamic binding of the pin attributes in the BSDL file to the pin attributes in the HVL test program file.

Once the objects are created, the header object, pin object, and bind object are compiled at 134 and may be used in a test simulation of the IC. Thus test programs written in any computer programming language may be used at 136 to simulate the circuit since the test programs are now independent of the IC since the attributes or information about the IC is already provided by each of the header, pin, and bind objects. As such, this provides for a generic methodology to test ICs whereby a dedicated test bench need not be generated manually for every circuit to toggle every pin in simulation. Furthermore, this also provides that the test programs may be reused for each device tested and new test programs need not be written for each device since the objects of the object oriented programming language are already created. Moreover, the test programs may be written not only to toggle or drive every pin of a circuit, but those of ordinary skill in the art will realize that this may be used to perform other functions on the circuit.

Figure 2:
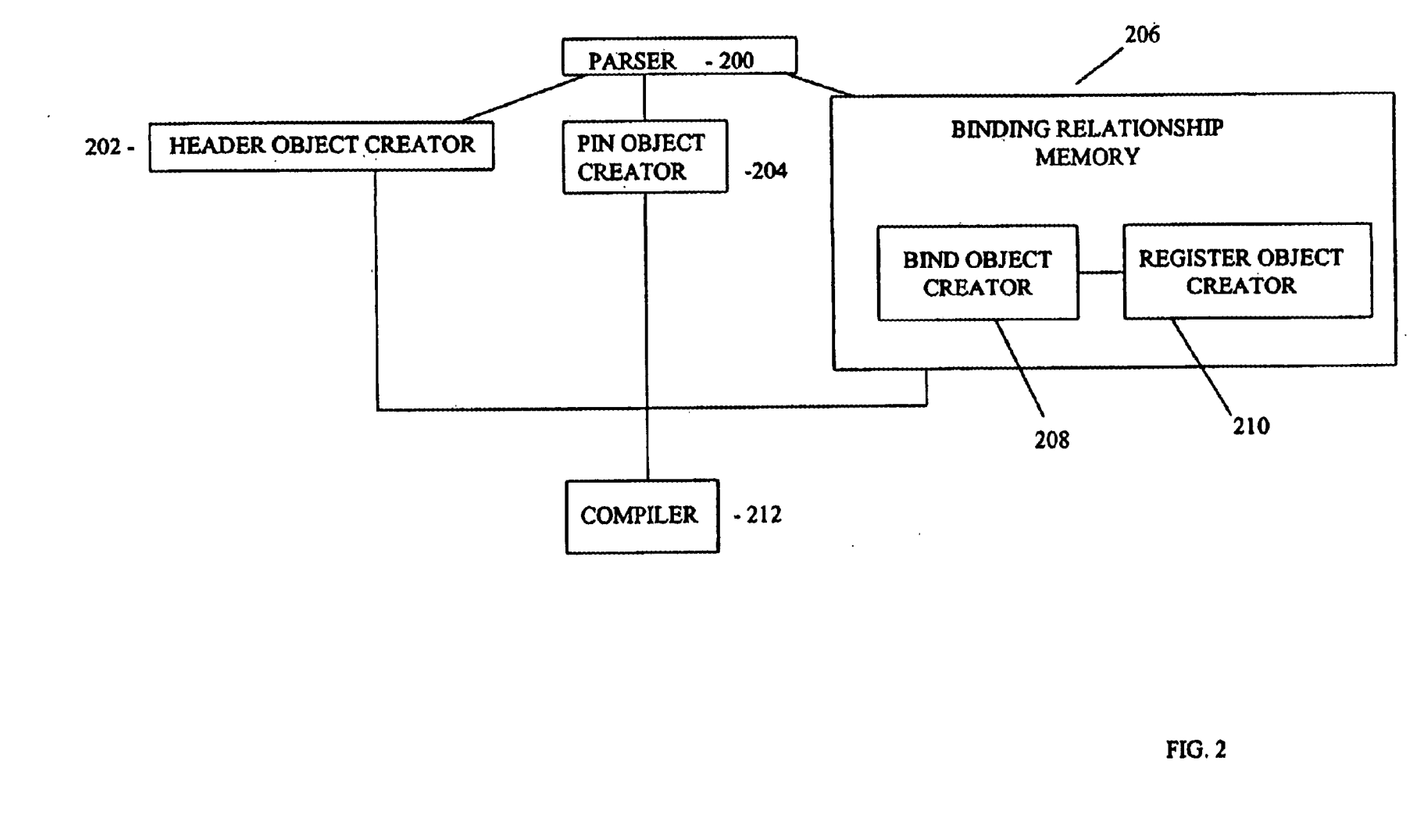
FIG. 2 is a block diagram of an apparatus in accordance with one embodiment of the present invention.

FIG. 2 is a block diagram of an apparatus to convert a BSDL file to an HVL test program file in accordance with one embodiment of the present invention. A BSDL file parser 200 scans for information within the BSDL file. The BSDL file represents the structure of the IC and contains the details or attributes of every pin in the circuit such as pin layout, the location of the pins, pin name, test access port (TAP) information, boundary scan register information, and other similar definitions or attributes.

Figure 3:
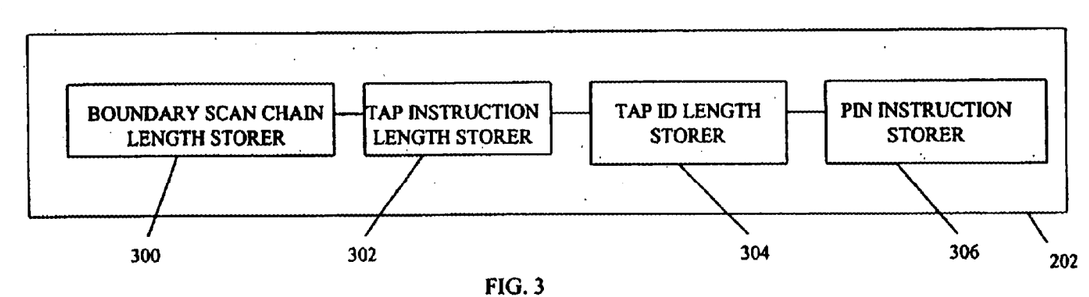
FIG. 3 is a block diagram of the header object creator in accordance with one embodiment of the present invention.

The BSDL file parser 200 is coupled to a header object creator 202, a pin object creator 204, and a binding relationship memory 206. The header object creator 202 is used to create an object to store attributes of header information scanned by the parser 200. The header information or attributes may be the length of the boundary scan chain, number of compliance pins, TAP instruction length, TAP identification length, and instructions to drive the pins through the register of the device. As shown in FIG. 3, a block diagram of the header object creator in accordance with one embodiment of the present invention, the header object creator 202 has a boundary scan chain length storer 300 which stores attributes of the boundary scan chain length. The header object creator 202 also has a TAP instruction length storer 302 coupled to the boundary scan chain length storer 300 to store attributes of the TAP instruction length, a TAP identification length storer 304 coupled to the TAP instruction length storer 302 to store attributes of the TAP identification length, and a pin instruction storer 306 coupled to the TAP identification length storer 304 to store attributes of pin instruction.

Figure 4:
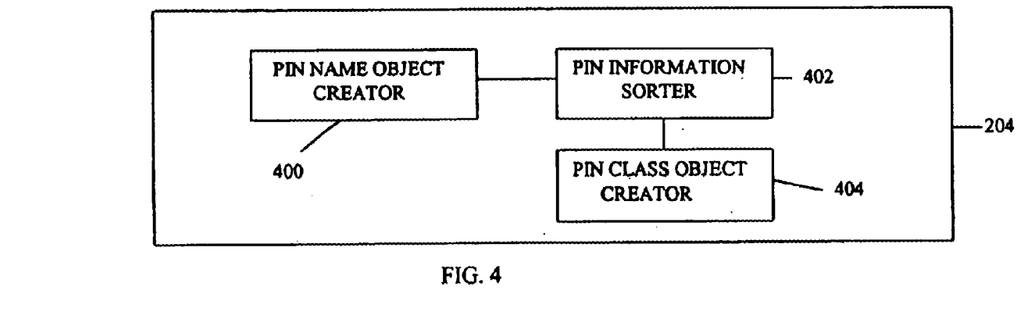
FIG. 4 is a block diagram of the pin object creator in accordance with one embodiment of the present invention.

The BSDL file parser 200 is also coupled to a pin object creator 204. Each piece of pin information corresponds to at least one pin in the BSDL file. The pin object creator 204 creates objects for each pin to store its attributes. The pin information may include attributes such as the class of the pin, name of the pin, the bind function the pin is bound to, the location of the pin on the circuit, the number of boundary scan registers per pin, and other similar attributes. The location of the pin may be its physical location on the circuit or its logical location. As shown in FIG. 4, a block diagram of the pin object creator in accordance with one embodiment of the present invention, the pin object creator has a pin name object creator 400 to create an object to store the pin name.

If there are more than one class of pins in the BSDL file, a pin information sorter 402 coupled to the pin name object creator 400 sorts the pin information according to class. A pin class object creator 404 coupled to the pin information sorter 402 may create an object to store each class of pins.

Referring back to FIG. 2, the binding relationship memory 206 may create a bind function to dynamically bind the pin attributes from the pin object creator 204 to variables corresponding to the HVL template. Each variable may be bound to the pin location of each pin, thus creating a binding relationship for each variable. In an embodiment of the present invention, the object oriented programming language may be Open Vera™ HVL, however, those of ordinary skill in the art will realize that any other object oriented computer programming language may be used. Open Vera™ is chosen in this embodiment due to its dynamic bind function capability. The bind function dynamically matches or hooks each variable to each pin attribute.

Figure 5:
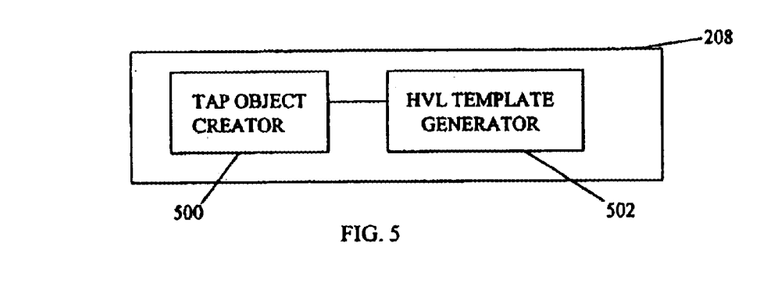
FIG. 5 is a block diagram of the bind object creator in accordance with one embodiment of the present invention.

The binding relationship memory 206 may store each binding relationship in its own object created by the bind object creator 208. As shown in FIG. 5, a block diagram of the bind object creator in accordance with one embodiment of the present invention, the bind object creator 208 may have a TAP object creator 500. The TAP object creator 500 coupled to the HVL template generator 502 may create an object to hold TAP attributes obtained from the BSDL file, such as TAP instructions, port name, and similar attributes.

The bind object creator 208 may have an HVL template generator 502 as shown in FIG. 5. The HVL template generator 502 may generate an HVL test program file that contains all information about the IC. The template may be automatically generated by the objected oriented programming language using descriptions of the IC previously inputted by a user. The template is generated to allow for the dynamic binding of the pin attributes in the BSDL file to the pin attributes in the HVL test program file.

A register object creator 210 of the binding relationship memory 206 may create an object to store each boundary scan register for each pin of the circuit. Each pin has at least three boundary scan registers to allow for bi-directional input/output data flow within the circuit. Thus, each register may be stored in its own object in the register object creator 210.

A compiler 212 is coupled to the header object creator 202, pin object creator 204, and binding relationship memory 206. The compiler can be any compiler that is well known to those, of ordinary skill in the art. The compiler may compile the attributes from each of the objects and use the objects to create a test program to simulate the circuit. Thus, test programs written in any computer programming language may be used to simulate the circuit since the test programs are now independent of the IC since the attributes or information about the digital device is already provided by each of the object creators. As such, this provides for a generic methodology to test ICs whereby a dedicated test bench need not be generated manually for every circuit to toggle every pin in simulation. Furthermore, this also provides that the test programs may be reused for each device tested and new test programs need not be written for each device since the objects of the object oriented programming language are already created. Moreover, the test programs may be written not only to toggle or drive every pin of a circuit, but those of ordinary skill in the art will realize that this may be used to perform other functions on the circuit.

Figure 6:
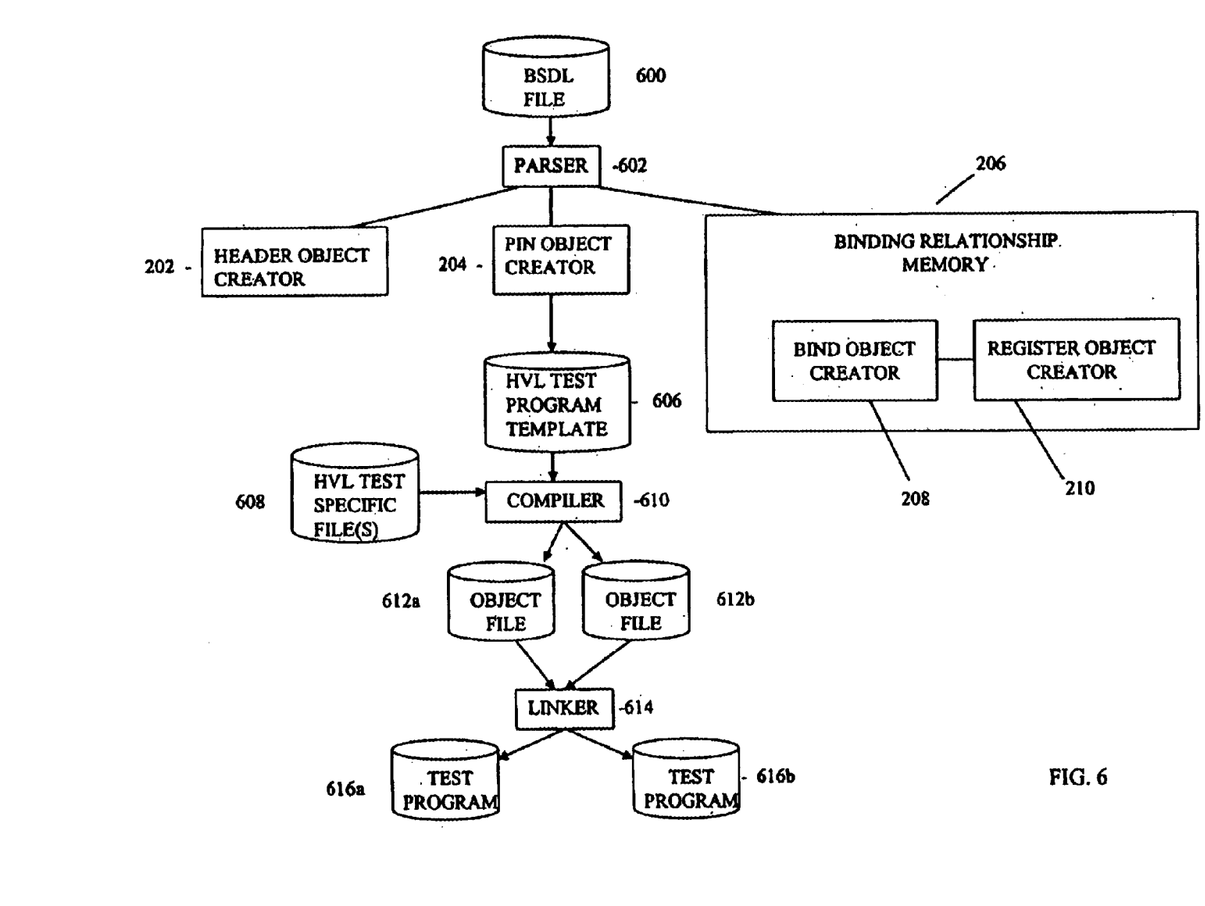
FIG. 6 is a block diagram illustrating the relationship between various databases and the apparatus of FIG. 2 in accordance with a specific embodiment of the present invention.

FIG. 6 is a block diagram illustrating the relationship between various databases and the apparatus of FIG. 2 in accordance with a specific embodiment of the present invention. A BSDL file 600 may be fed into the parser 602. Later, the pin object creator 604 may output an HVL test program template 606. A generic HVL test specific file or files 608 may then be fed into a compiler 610 with the HVL test program template 606. The output of the compiler is one or more object files 612a, 612b, which then may be linked by a linker 614 for ultimately outputting one or more test programs 616a, 616b.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A method for converting a hardware attribute (HA) file to a hardware verification language (HVL) test program file, comprising:

scanning said HA file for header information;

storing the header information in a header object;

scanning said HA file for pin information, the pin information corresponding to at least one pin in the HA file having a pin location;

storing the pin information in a pin object;

creating at least one variable for said HVL file;

binding each of said variables to one of said pin locations resulting in a binding relationship for each variable; and storing said binding relationships in a bind object.

2. The method of claim 1 wherein said header information comprises the length of a boundary scan chain.

3. The method of claim 1 wherein said header information comprises the Test Access Port (TAP) instruction length.

4. The method of claim 1 wherein said header information comprises a TAP identification length.

5. The method of claim 1 wherein said header information comprises the instructions to toggle said pins.

6. The method of claim 1 wherein said scanning said HA for pin information further comprises sorting said pin information into at least one class of pins.

7. The method of claim 6 further comprising storing each of said class of pins in a pin class object.

8. The method of claim 1 wherein said pin information further comprises the name of said pin.

9. The method of claim 1 wherein said pin location is the physical location of said pin.

10. The method of claim 1 wherein said pin location is the logic location of said pin.

11. The method of claim 1 further comprising:

scanning said HA file for at least one Test Access Port (TAP) file;

creating a TAP definition for each of said TAP files; and storing said TAP definition in a TAP object.

12. The method of claim 1 further comprising:

generating an HVL file template having digital device descriptions; and storing said template in a digital device object.

13. The method of claim 1 wherein said bind object further comprises at least three boundary scan registers for each of said pins.

14. The method of claim 13 further comprising storing each of said at least three boundary scan registers in a register object.

15. The method of claim 1 further comprising compiling said header object, said pin object, and said bind object.

16. The method of claim 1 wherein said HVL file is written in Open Vera™ language.

17. The method of claim 1 wherein said binding further comprises a bind function.

18. A method for converting a boundary scan test description language (BSDL) file to a Open Vera™ hardware verification language (HVL) test program file, comprising:

scanning said BSDL file for header attributes;

storing the header attributes in a header object;

searching said BSDL file for pin attributes, the pin attributes corresponding to at least one pin in the BSDL file having a pin location;

storing the pin attributes in a pin object;

creating at least one variable attributes for said HVL file;

binding each of said variable attributes to one of said pin locations resulting in a binding relationship for each variable attribute; and storing said binding relationships in a bind object.

19. The method of claim 18 wherein said scanning further comprises:

looking for a boundary length attribute;

obtaining a value after the boundary length attribute; and inputting said value in said header object.

20. The method of claim 18 wherein said scanning further comprises:

looking for an instruction length attribute;

obtaining a value after an instruction length attribute;

inputting said value into said header object.

21. The method of claim 18 wherein said scanning further comprises:

looking for a TAP identification length attribute;

obtaining a value after the TAP identification length attribute; and inputting said value into said header object.

22. The method of claim 18 wherein said searching further comprises:

scanning said BSDL file for a physical pin map attribute;

obtaining said pin location from said physical pin map attribute; and inputting said pin location into said pin object.

23. The method of claim 18 wherein said searching further comprises:

looking for a pin body attribute;

obtaining a pin location from said pin body attribute obtaining said at least one variable attribute;

matching said at least one variable attribute to said pin location;

storing said matched variable attribute and said pin location in said pin object.

24. The method of claim 18 further comprising:

scanning said BSDL file for a TAP attribute;

obtaining said TAP information from the TAP attribute;

inputting said TAP information into said bind object.

25. The method of claim 18 further comprising:

scanning said BSDL file for a boundary register attribute;

obtaining at least three boundary scan registered for each of said pins;

inputting said boundary scan registers in a register object.

26. The method of claim 18 further comprising compiling said header object, said pin object, and said bind object.

27. An apparatus to convert a boundary scan test description language (BSDL) file to a hardware verification language (HVL) test program file having at least one variable, comprising:

a BSDL file parser;

a header object creator coupled to the parser;

a pin object creator coupled to the parser;

a binding relationship memory coupled to the parser; and a bind object creator coupled to the binding relationship memory.

28. The apparatus of claim 27 wherein said header object creator comprises a boundary scan chain length storer.

29. The apparatus of claim 27 wherein said header object creator comprises a Test Access Port (TAP) instruction length storer.

30. The apparatus of claim 27 wherein said header object creator comprises a TAP identification length storer.

31. The apparatus of claim 27 wherein said header object creator comprises a pin instruction storer.

32. The apparatus of claim 27 further comprising a pin information sorter coupled to said pin object creator.

33. The apparatus of claim 32 further comprising a pin class object creator coupled to said pin information sorter.

34. The apparatus of claim 27 wherein said pin object creator further comprises a pin name object creator.

35. The apparatus of claim 27 further comprising a TAP object creator coupled to said bind object creator.

36. The apparatus of claim 27 further comprising an HVL file template generator coupled to said bind object creator.

37. The apparatus of claim 27 further comprising a register object creator coupled to said bind relationship memory.

38. The apparatus of claim 27 further comprising a compiler coupled to said header object creator, said pin object creator, and said bind object creator.

39. An apparatus to convert a boundary scan test description language (BSDL) file to a hardware verification language (HVL) test program file, comprising:
- means for scanning said BSDL file for header information;
- means for storing the header information in a header object;
- means for scanning said BSDL file for pin information, the pin information corresponding to at least one pin in the BSDL file having a pin location;
- means for storing the pin information in a pin object;
- means for creating at least one variable for said HVL file;
- means for binding each of said variables to one of said pin locations resulting in a binding relationship for each variable; and
- means for storing said binding relationships in a bind object.

40. The apparatus of claim 39 wherein said header information comprises the length of a boundary scan chain.

41. The apparatus of claim 39 wherein said header information comprises the Test Access Port (TAP) instruction length.

42. The apparatus of claim 39 wherein said header information comprises a TAP identification length.

43. The apparatus of claim 39 wherein said header information comprises the instructions to toggle said pins.

44. The apparatus of claim 39 wherein said scanning said BSDL for pin information further comprises sorting said pin information into at least one class of pins.

45. The apparatus of claim 44 further comprising means for storing each of said class of pins in a pin class object.

46. The apparatus of claim 39 wherein said pin information further comprises the name of said pin.

47. The apparatus of claim 39 wherein said pin location is the physical location of said pin.

48. The apparatus of claim 39 wherein said pin location is the logic location of said pin.

49. The apparatus of claim 39 further comprising:
- means for scanning said BSDL file for at least one Test Access Port (TAP) file;
- means for creating a TAP definition for each of said TAP files; and
- means for storing said TAP definition in a TAP object.

50. The apparatus of claim 39 further comprising:
- means for generating an HVL file template having digital device descriptions; and
- means for storing said template in a digital device object.

51. The apparatus of claim 39 wherein said bind object further comprises at least three boundary scan registers for each of said pins.

52. The apparatus of claim 51 further comprising means for storing each of said at least three boundary scan registers in a register object.

53. The apparatus of claim 39 further comprising means for compiling said header object, said pin object, and said bind object.

54. The apparatus of claim 39 wherein said HVL file is written in Open Vera™ language.

55. The apparatus of claim 39 wherein said binding further comprises a bind function.

56. A program storage device readable by a machine, tangibly embodying a program of instructions executable by the machine to perform a method for converting a boundary scan test description language (BSDL) file to a hardware verification language (HVL) test program file, said method comprising scanning said BSDL file for header information;
- storing the header information in a header object;
- scanning said BSDL file for pin information, the pin information corresponding to at least one pin in the BSDL file having a pin location;
- storing the pin information in a pin object;
- creating at least one variable for said HVL file;
- binding each of said variables to one of said pin locations resulting in a binding relationship for each variable; and
- storing said binding relationships in a bind object.

57. A program storage device readable by a machine, tangibly embodying a program of instructions executable by the machine to perform a method for converting a boundary scan test description language (BSDL) test program file to a Open Vera™ hardware verification language (HVL) file, said method comprising:
- scanning said BSDL file for header information attributes;
- storing the header information attributes in a header object;
- searching said BSDL file for pin attributes, the pin attributes corresponding to at least one pin in the BSDL file having a pin location;
- storing the pin attributes in a pin object;
- creating at least one variable attribute for said HVL file;
- binding each of said variable attributes to one of said pin locations resulting in a binding relationship for each variable attribute; and
- storing said binding relationships in a bind object.

* * * * *